United States Patent
Hirasawa et al.

(10) Patent No.: US 9,069,125 B2
(45) Date of Patent: Jun. 30, 2015

(54) OPTICAL PRODUCT AND METHOD FOR MANUFACTURING SAME

(71) Applicant: Tokai Optical Co., Ltd., Okazaki-Shi (JP)

(72) Inventors: Shinya Hirasawa, Okazaki (JP); Yoshinori Takahashi, Okazaki (JP); Tetsuo Kozaki, Okazaki (JP); Yuji Kato, Okazaki (JP)

(73) Assignee: Tokai Optical Co., Ltd, Okazaki-Shi (JP)

( * ) Notice: Subject to any disclaimer, the term of this patent is extended or adjusted under 35 U.S.C. 154(b) by 0 days.

(21) Appl. No.: 14/333,771

(22) Filed: Jul. 17, 2014

(65) Prior Publication Data

US 2014/0329072 A1 Nov. 6, 2014

Related U.S. Application Data

(63) Continuation of application No. PCT/JP2013/052067, filed on Jan. 30, 2013.

(30) Foreign Application Priority Data

Feb. 8, 2012 (JP) ................................ 2012-025178

(51) Int. Cl.

| G02B 1/11 | (2006.01) |
|---|---|
| C23C 16/30 | (2006.01) |
| C23C 16/40 | (2006.01) |
| C23C 16/513 | (2006.01) |
| G02B 1/116 | (2015.01) |
| B32B 9/00 | (2006.01) |
| G02B 1/10 | (2015.01) |
| G02B 1/115 | (2015.01) |
| C03C 17/34 | (2006.01) |

(52) U.S. Cl.
CPC ......... G02B 1/116 (2013.01); *Y10T 428/24975* (2015.01); *Y10T 428/24942* (2015.01); *Y10T 428/265* (2015.01); *C03C 17/3417* (2013.01); *C03C 17/3452* (2013.01); *C03C 2217/22* (2013.01); *C03C 2217/231* (2013.01); B32B 9/00 (2013.01); C23C 16/30 (2013.01); C23C 16/402 (2013.01); C23C 16/405 (2013.01); C23C 16/407 (2013.01); C23C 16/513 (2013.01); G02B 1/105 (2013.01); G02B 1/115 (2013.01)

(58) Field of Classification Search
None
See application file for complete search history.

(56) References Cited

U.S. PATENT DOCUMENTS 6,569,516 B1 * 5/2003 Nakamura et al. ............ 428/212
2004/0005482 A1 1/2004 Kobayashi et al.

FOREIGN PATENT DOCUMENTS

| JP | 61-168899 | 7/1986 |
| JP | 63-266401 | 11/1988 |
| JP | 2003-215309 A | 7/2003 |
| JP | 2005-070724 A | 3/2005 |
| JP | 2011-113050 A | 6/2011 |

OTHER PUBLICATIONS

International Search Report, International Application No. PCT/JP2013/052067, dated May 7, 2013 (8 pages).

* cited by examiner

*Primary Examiner* — David Sample
*Assistant Examiner* — Nicole T Gugliotta
(74) *Attorney, Agent, or Firm* — Burr & Brown, PLLC

(57) ABSTRACT

An optical product according to the present invention includes a transparent base material, and a multilayer film including a dielectric film and an ITO film. The multilayer film is formed on one face or two faces of the transparent base material. The physical thickness of the ITO film is not less than 3 nanometers and not greater than 7 nanometers. The ITO film can be formed by vapor deposition with plasma treatment.

10 Claims, 11 Drawing Sheets

OPTICAL PRODUCT AND METHOD FOR MANUFACTURING SAME

CROSS-REFERENCE TO RELATED APPLICATION

This application claims the entire benefit of Japanese Patent Application Number 2012-025178 filed on Feb. 8, 2012 and International Patent Application PCT/JP2013/052067 filed on Jan. 30, 2013, the entirety of which is incorporated by reference.

BACKGROUND OF THE INVENTION

1. Field of the Invention

The present invention relates to optical products such as lenses and filters, and relates to a method for manufacturing the same.

2. Description of Related Art

As optical products having antistatic functions and antireflection functions, conductive antireflection films described in Japanese Laid-Open Patent Publication Numbers S61-168899 and S63-266401 are known. These optical products are each composed of three or four layers in total, and in each optical product, ITO (Indium Tin Oxide) and magnesium fluoride ($MgF_2$) are laminated by a vacuum deposition method. Such an optical product has an antistatic function by being provided with conductivity mainly by the ITO and has an antireflection function by $MgF_2$ having a low refractive index. Moreover, in these optical products, $MgF_2$ is arranged at the outermost layer.

SUMMARY OF THE INVENTION

In many of these optical products, when the reference wavelength is $\lambda_0$=500 nm (nanometer), the optical thickness of an ITO film ranges from 0.331 $\lambda_0$ to 0.516 $\lambda_0$. The optical thickness of 0.063 $\lambda_0$ and 2.136 $\lambda_0$ are also seen. The former optical thickness, in particular, is the optical thickness of one of two ITO films provided in total, and the optical thickness of the other ITO film is 0.484 $\lambda_0$ (Table 2 in Japanese Laid-Open Patent Publication No. S61-168899). The ITO film having the former optical thickness has a thin optical thickness compared with others, but it has a volume of a physical thickness of about 31.5 nm.

When an optical product has ITO films having the optical thicknesses described above, the antistatic performance becomes very good, but a necessary material amount and the film forming time increase, which leads to increased costs. Moreover, when a film is to be incorporated into a multilayer film in order to further provide an antireflection function, the degree of freedom in design is reduced. Moreover, for example, the possibility of occurrence of ununiform portions during film formation is relatively large, and an absorption amount of incident light is increased due to a characteristic of ITO that absorbs a part of light passing therethrough. For these or other reasons, the possibility that the optical performance of the optical product is affected is also relatively increased.

Therefore, an object of the invention is to provide a low-cost optical product having an antistatic function, easy to be designed, and having very good optical performance, and a method for manufacturing the same.

In addition, in those optical products mentioned above, the ITO film and the $MgF_2$ film are formed adjacent to each other by a simple vacuum deposition method, and thus, interaction therebetween causes slight opacity or slight scattering. Therefore, the optical performance for transmitted light may be affected.

Moreover, such an optical product is composed of three or four layers, and further reduction of the reflectance thereof is encouraged.

Further, in such an optical product, $MgF_2$ at the outermost layer is not protected, and improvement of the durability thereof is encouraged.

Thus, another object of the invention is to provide an optical product which has both an antistatic function and an extremely low reflection function by use of ITO and $MgF_2$ therein and, at the same time, which also has a good optical performance for transmitted light. Another object of the invention is to provide a method for manufacturing such an optical product.

In those optical products mentioned above, due to simple introduction of an ITO film and a $MgF_2$ film, characteristics regarding reflectance and surface smoothness have not been satisfactory, when viewed from high levels.

Therefore, another object of the invention is to provide an optical product which has both an antistatic function and an extremely low reflection function, has good optical performance for transmitted light, and further has good smoothness.

In order to attain the above objects, a first aspect of the invention is an optical product that includes a transparent base material, and a multilayer film including a dielectric film and an ITO film. The multilayer film is formed on one face or two faces of the transparent base material. In the optical product, a physical thickness of the ITO film is not less than 3 nm and not greater than 7 nm.

In order to attain the above objects, a second aspect of the invention is characterized in that, in the above invention, the dielectric film on a surface side relative to the ITO film includes a $ZrO_2$ film.

In order to attain the above objects, a third aspect of the invention is characterized in that, in the above invention, the $ZrO_2$ film is arranged directly above the ITO film.

In order to attain the above objects, a fourth aspect of the invention is characterized in that, in the above invention, the $ZrO_2$ film is arranged directly above and directly below the ITO film.

In order to attain the above objects, a fifth aspect of the invention is characterized in that, in the above invention, the dielectric film includes a $MgF_2$ film, and the ITO film and the $MgF_2$ film are arranged so as not to be adjacent to each other.

A sixth aspect of the invention is characterized in that, in the above invention, when an outermost layer of the multilayer film is a first layer, the $MgF_2$ film is arranged at a second layer or a third layer.

In order to attain the above objects, a seventh aspect of the invention is characterized in that, in the above invention, the ITO film is formed by vapor deposition with plasma treatment.

An eighth aspect of the invention is characterized in that, in the above invention, at the outermost layer of the multilayer film, a fluorine-based resin film or a $SiO_2$ film is arranged.

A ninth aspect of the invention is characterized in that, in the above invention, the $SiO_2$ film at the outermost layer of the multilayer film is formed by vapor deposition with plasma treatment.

A tenth aspect of the invention is characterized in that, in the above invention, a physical thickness of the fluorine-based resin film is not greater than 10 nm.

An eleventh aspect of the invention is characterized in that, in the above invention, a plurality of the dielectric films including a high refractive index material and an intermediate refractive index material are formed, and in the multilayer film, the high refractive index material and the intermediate refractive index material are alternately arranged.

In order to attain the above objects, a twelfth aspect of the invention is a method for manufacturing the optical product above, wherein the ITO film is formed by vapor deposition with plasma treatment.

A thirteenth aspect of the invention is characterized in that, in the above invention, the outermost layer is a $SiO_2$ film which is formed by vapor deposition with plasma treatment.

With the invention according to the first and twelfth aspects, a low-cost optical product having an antistatic function, easy to be designed, and having very good optical performance, and a method for manufacturing the same can be provided.

With the invention according to the second to fourth aspects, the optical product can have both an antistatic function and an extremely low reflection function, and at the same time, can have good optical performance. Further, the optical product can maintain good smoothness.

With the invention according to the fifth and seventh aspects, the optical product can have both an antistatic function and an extremely low reflection function, and, at the same time, can have good optical performance.

With the invention according to the eighth, ninth and thirteenth aspects, the durability of the optical product can be further improved, and when a fluorine-based resin film is used, the optical product can also have a water repellent function.

With the invention according to the tenth aspect, by making the fluorine-based resin film uniform, the optical product can have a water repellent function, and at the same time, can maintain optical performance.

With the invention according to the sixth and eleventh aspects, further lower reflectance can be easily realized.

DETAILED DESCRIPTION OF THE INVENTION

Figure 1:
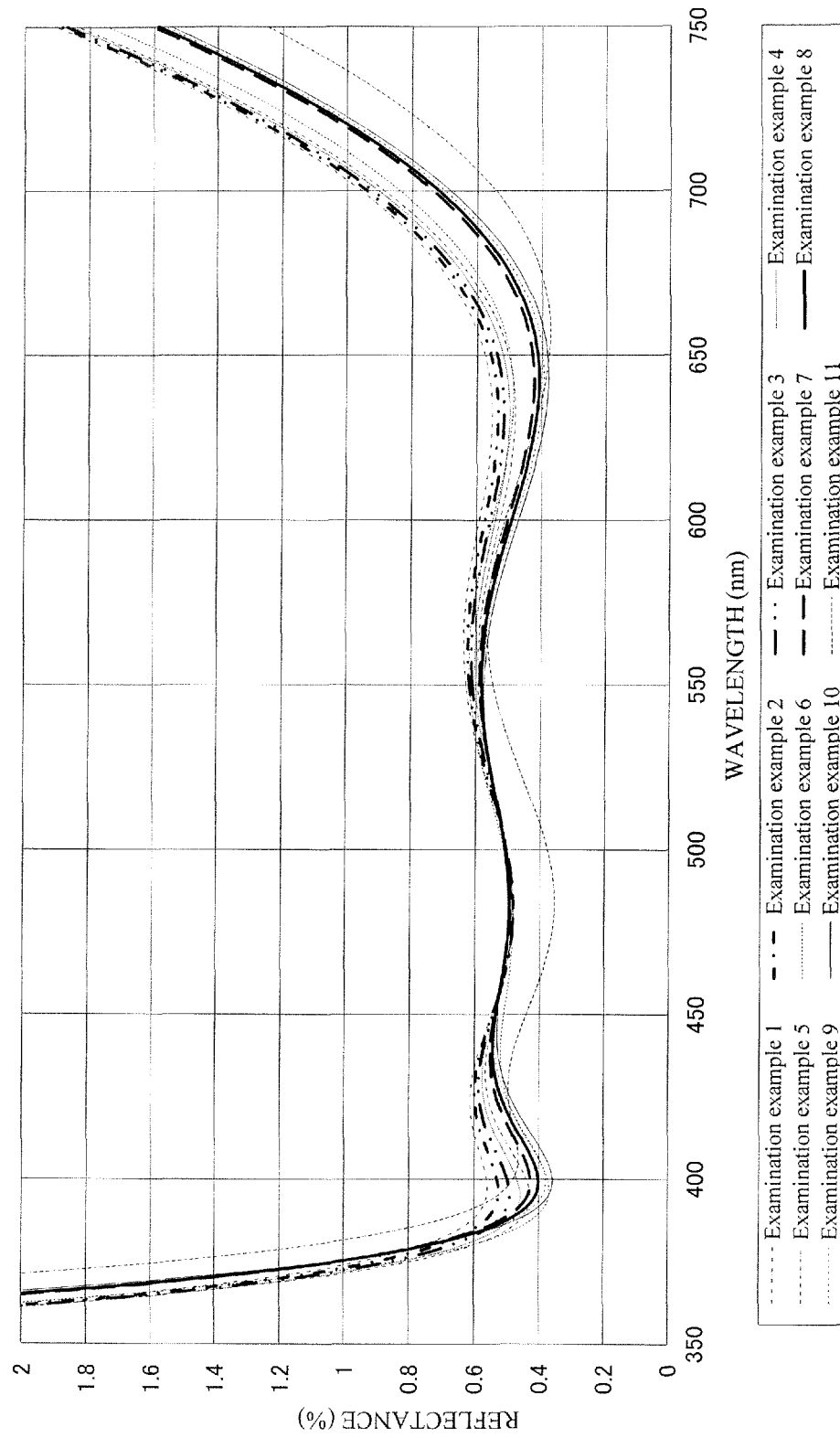
FIG. 1 is a graph showing spectral distribution of reflectance of Examination Examples 1 to 11.

Hereinafter, examples of embodiments according to the present invention will be described. It should be noted that the embodiments of the present invention are not limited thereto.

In an optical product according to the present invention, a multilayer film including, as components thereof, a dielectric film and a transparent conductive film is formed on one face or both faces of a transparent base material. Preferably, two or more types of the dielectric film are used.

Being transparent means having translucency and includes being semitransparent.

Preferably, at least one of the films is formed by vapor deposition, and in this case, optical characteristics of the optical product can be prevented from being affected due to various types of films being formed on the edge surface of the optical product.

The dielectric films are used (in combination with other films as appropriate) as components mainly for providing an antireflection function, and for the dielectric films, a high refractive index material and an intermediate refractive index material are used in combination. A low refractive index material means a material whose refractive index is about 1.5 or lower, an intermediate refractive index material means a material whose refractive index is about 1.5 to 1.8, and a high refractive index material means a material whose refractive index is about 1.8 or higher.

Here, in order to provide an antireflection function that realizes a low reflectance such as about 1 percent (%) or lower, preferably about 0.5% or lower, a plurality of types of dielectric films are alternately arranged. Preferably, a high refractive index material and an intermediate refractive index material are alternately laminated.

Preferably, one layer of a $MgF_2$ film is arranged as near as possible to the outermost layer. Then, between the $MgF_2$ film and the base material, a plurality of types of dielectric films are alternately arranged. Preferably, a high refractive index material and an intermediate refractive index material are alternately laminated.

Specific examples of materials of the dielectric films include metal oxides such as titanium dioxide ($TiO_2$), tantalum pentoxide ($Ta_2O_5$), zirconium dioxide ($ZrO_2$), aluminium oxide ($Al_2O_3$), niobium pentoxide ($Nb_2O_5$), and silicon dioxide ($SiO_2$).

The transparent conductive film is made of ITO.

Further, in the optical product according to the present invention, preferably, a $SiO_2$ film or a fluorine-based resin film is arranged at the outermost layer.

Use of a fluorine-based resin film at the outermost layer facilitates handling of the optical product, because, for example, inner films can be protected, and water repellent performance can be provided. Even if water drops and smudges are attached to the optical product, they can be easily removed.

It is sufficient that the fluorine-based resin exhibits water repellent property when formed into a film, and a fluorine-based resin commercially available can be used as appropriate.

It should be noted that the physical thickness of the fluorine-based resin film (water repellent film) is preferably not greater than 10 nanometers (nm), from the view point of providing uniformity to realize good optical performance and good water repellent performance.

If a $SiO_2$ film is used at the outermost layer, inner films can also be protected, and if the $SiO_2$ film is formed by vapor deposition with plasma treatment such as ion assisted deposition (IAD), the strength of the film is increased, whereby the durability of the optical product can be further improved.

The physical thickness of the transparent conductive film is not less than 3 nm from the view point of providing a sufficient antistatic property. When the physical thickness of the transparent conductive film is less than 3 nm, static electricity may occur when the optical product is wiped or the like.

The physical thickness of the transparent conductive film is not greater than 7 nm from the view points of securing sufficient reduction of an absorption amount of light that is incident on the multilayer film so as to pass therethrough, and of securing uniformity of the transparent conductive film (from the view point of providing excellent optical performance for incident light). When the physical thickness of the transparent conductive film exceeds 7 nm, in an optical product, especially in a camera filter, an absorption amount of incident light thereon becomes too large, which is not preferable from the view point of letting the incident light pass therethrough as much as possible.

When the transparent conductive film is formed by vapor deposition with plasma treatment such as IAD, the film formation can be performed more stably, and the optical performance can further be improved.

In addition, the $MgF_2$ film and the transparent conductive film are arranged separately from each other. That is, between these films, one or more films are inserted.

Since the $MgF_2$ film and the transparent conductive film are arranged separately from each other, they are prevented from coming into contact with each other, and therefore, occurrence of interaction due to the contact, i.e., occurrence of opacity or scattering, can be avoided.

Thus, for example, the $MgF_2$ film is arranged at the first layer, and the transparent conductive film is arranged at the third layer or at a lower-order layer (the $MgF_2$ film is at the third layer in a case where the first layer is a protective film that is less likely to adhere to the $MgF_2$ film, and the transparent conductive film is at the fifth layer or at a lower-order layer).

In a case where the transparent conductive film is formed by vapor deposition with plasma treatment such as IAD, even when the transparent conductive film is adjacent to the $MgF_2$ film, no occurrence of interaction such as opacity or scattering is observed, and as in the case where the $MgF_2$ film and the transparent conductive film are arranged separately from each other, the optical product can have both of an extremely low reflection function and an antistatic function, and can have good optical performance, causing hardly any scattering.

The outer layer side the $MgF_2$ film having a low refractive index is arranged on, the easier it becomes to realize low reflection. However, in consideration that a protective film is needed at the outermost layer in order to protect the $MgF_2$ film, the $MgF_2$ film is preferably arranged at the second layer. In a case where a binder layer is inserted between the protective film and the $MgF_2$ film when, for example, adhesion therebetween needs to be secured, the hinder layer becomes the second layer, and thus, the $MgF_2$ film is preferably arranged at the third layer.

Moreover, from the view point of realizing both characteristics regarding reflectance and smoothness in particular, while providing antistatic property, it is preferable that the dielectric films include a $ZrO_2$ film. The $ZrO_2$ film realizes good smoothness by absorbing surface roughness of the ITO film and the $MgF_2$ film while maintaining good characteristics regarding reflectance. Therefore, it is preferable that the $ZrO_2$ film is included in any of the dielectric films on the surface side relative to the ITO film. Further, it is more preferable that the $ZrO_2$ film is directly above the ITO film. It is further preferable that the $ZrO_2$ film is provided directly above and directly below the ITO film.

Further, if the ITO film is formed by IAD, very good characteristics regarding reflectance and very good smoothness can be realized, in addition to antistatic property.

Such an optical product can be used for a spectacle lens, a camera lens, or the like, but when the extremely low reflection function or the like of the optical product is focused, the optical product is preferably used as a camera filter such as a lens protection filter, in particular.

Next, with respect to preferable Examples of the present invention, and Comparative Examples not belonging to the present invention, in the first half, a plurality of Examination Examples (Examination Examples 1 to 17) are examined and then which of Examples and Comparative Examples (Examples A to J, and Comparative Examples A to G) each Examination Example corresponds to will be described in accordance with a determination procedure. Then, in the second half, Examples and Comparative Examples (Examples 1 to 9, Comparative Examples 1 to 3, and Examples 10 to 13) will be described.

Examination Examples 1 to 11

As optical products according to Examination Examples 1 to 11, optical products were prepared in which a multilayer film having the following configuration was formed on one face of a flat substrate made of white sheet glass having a diameter of 70 millimeters (mm) and a thickness of 1.8 mm. An ITO film was arranged at the third layer. The outermost layer was the first layer. The layer configurations of Examination Examples 1 to 11 are as shown below.

(substrate/) $SiO_2$ film/$ZrO_2$ film/$SiO_2$ film/$ZrO_2$ film/$SiO_2$ film/$ZrO_2$ film/ITO film (IAD)/$SiO_2$ film (IAD)/fluorine-based resin film The physical thickness of the ITO film (transparent conductive film) in Examination Example 1 was 1 nm, and the physical thickness of the ITO film in Examination Example 2 was 2 nm. Thereafter, the physical thickness of the ITO film was sequentially increased in each Examination Example by 1 nm, until Examination Example 10 in which the physical thickness thereof was 10 nm was prepared. The physical thickness of the ITO film of Examination Example 11 was 20 nm.

The various types of films in Examination Examples 1 to 11 were all formed by a vacuum deposition method. It should be noted that, except for fluorine-based resin films and $SiO_2$ films, during vapor deposition, $O_2$ gas was introduced by an amount that made the degree of vacuum a set value ($5.0 \times 10^{-3}$ pascal (Pa)).

In particular, the ITO film and the $SiO_2$ film at the second layer when the outermost layer was the first layer were formed by vapor deposition using IAD, that is, ion-assist was performed during the vacuum deposition. Here, ionized Ar gas was used, the acceleration voltage and current were 100 V (volt) and 600 mA (milliampere), and the bias current was 1000 mA. In addition, $O_2$ gas was introduced.

The fluorine-based resin film was formed in the following manner. The substrate having antireflection films already formed thereon was subjected to water repellent treatment by a vacuum deposition method. As a water repellent, an organosilicon compound (KY-8 manufactured by Shin-Etsu Chemical Co., Ltd.) was used to form a thin film layer.

The physical thickness of the fluorine-based resin film of each of Examination Examples 1 to 11 was 5 nm, and the thickness of each of SiO$_2$ films and ZrO$_2$ films as a plurality of types of dielectric films was set to a value designed from the view point of antireflection (reduction of reflectance).

Examination Examples 12 to 14 and Generic Product

As an optical product according to Examination Example 12, an optical product was prepared in which a multilayer film having the following configuration was formed on one face of the same substrate as used in Examination Example 1 and the like. The ITO film had a thickness of 3 nm, and was arranged at the fifth layer. Each film was formed in the same manner as in Examination Example 1 and the like. The outermost layer was the first layer. The layer configuration of Examination Example 12 is as shown below.

(substrate/) SiO$_2$ film/ZrO$_2$ film/SiO$_2$ film/ZrO$_2$ film/ITO film (IAD)/SiO$_2$ film/ZrO$_2$ film/SiO$_2$ film (IAD)/fluorine-based resin film As an optical product according to Examination Example 13, an optical product was prepared in which a multilayer film having the following configuration was formed on one face of the same substrate as used in Examination Example 1 and the like. The ITO film had a thickness of 3 nm, and was arranged at the seventh layer. Each film was formed in the same manner as in Examination Example 1 and the like. The outermost layer was the first layer. The layer configuration of Examination Example 13 is as shown below.

(substrate/) SiO$_2$ film/ZrO$_2$ film/ITO film (IAD)/SiO$_2$ film/ZrO$_2$ film/SiO$_2$ film/ZrO$_2$ film/SiO$_2$ film (IAD)/fluorine-based resin film As an optical product according to Examination Example 14, an optical product was prepared in which a multilayer film having the following configuration was formed on one face of the same substrate as used in Examination Example 1 and the like. The ITO film had a thickness of 3 nm, and was arranged at the innermost layer (the ninth layer) immediately above the substrate. Each film was formed in the same manner as in Examination Example 1 and the like. The outermost layer was the first layer. The layer configuration of Examination Example 14 is as shown below.

(substrate/) ITO film (IAD)/SiO$_2$ film/ZrO$_2$ film/SiO$_2$ film/ZrO$_2$ film/SiO$_2$ film/ZrO$_2$ film/SiO$_2$ film (IAD)/fluorine-based resin film As a reference to be used in examination, a generic product that is easily commercially available was also prepared. This generic product was a camera filter (protection filter for camera lens) and was said to have an antireflection function.

Examination Examples 15 to 17

As optical products according to Examination Examples 15 to 17, optical products were prepared in which a multilayer film having the configuration shown in Table 1 below was formed on one face of the same substrate as used in Examination Example 1 and the like. In this table, each numerical value represents a physical thickness, and the layer on the substrate side is the first layer.

The layer configurations of Examination Examples 15 to 17 are as shown below in order of Examination Examples 15 to 17.

(substrate/) SiO$_2$ film/ZrO$_2$ film/SiO$_2$ film/ZrO$_2$ film/SiO$_2$ film/ZrO$_2$ film/ITO film (3 nm, IAD)/SiO$_2$ film (substrate/) SiO$_2$ film/ZrO$_2$ film/SiO$_2$ film/ZrO$_2$ film/SiO$_2$ film/ZrO$_2$ film/ITO film (2 nm, IAD)/SiO$_2$ film (substrate/) ITO film (3 nm, IAD)/SiO$_2$ film/ZrO$_2$ film/SiO$_2$ film/ZrO$_2$ film/SiO$_2$ film/ZrO$_2$ film/SiO$_2$ film

TABLE 1

|  | First layer | Second layer | Third layer | Fourth layer | Fifth layer | Sixth layer | Seventh layer | Eighth layer |
|---|---|---|---|---|---|---|---|---|
| Examination Example 15 | 29.58 nm | 10.16 nm | 33.88 nm | 16.33 nm | 15.77 nm | 113.13 nm | 3.00 nm | 81.50 nm |
| Examination Example 16 | 29.58 nm | 10.16 nm | 33.88 nm | 16.33 nm | 15.77 nm | 114.13 nm | 2.00 nm | 81.50 nm |
| Examination Example 17 | 3.00 nm | 31.77 nm | 8.58 nm | 36.44 nm | 17.30 nm | 16.90 nm | 119.56 nm | 83.75 nm |

Examination of Examination Examples 1 to 17

Figure 2:
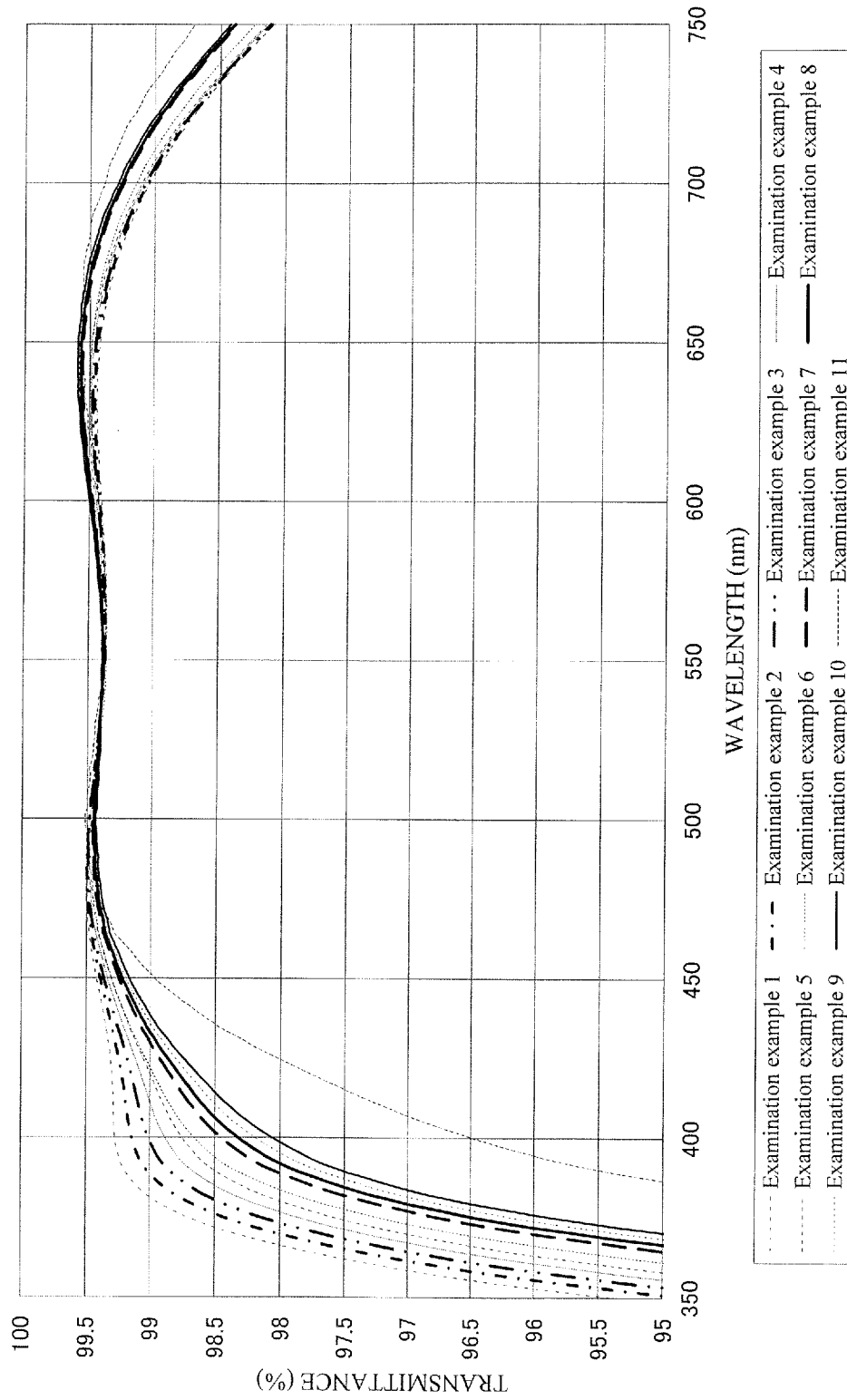
FIG. 2 is a graph showing spectral distribution of transmittance of Examination Examples 1 to 11.
Figure 3:
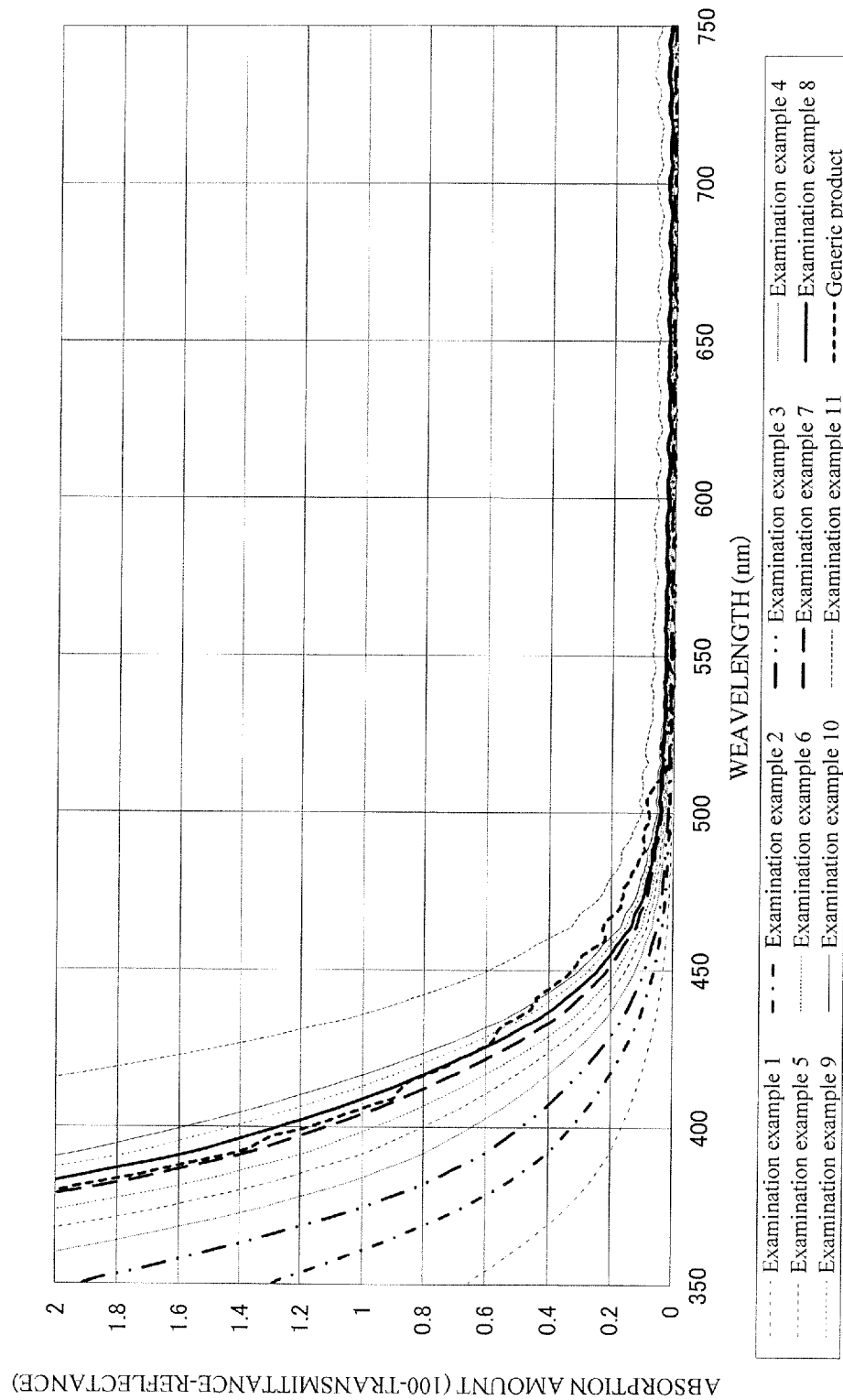
FIG. 3 is a graph showing spectral distribution of absorption/scattering amount of Examination Examples 1 to 11 and a generic product.

With respect to Examination Examples 1 to 11 and the generic product, the absorption/scattering amount of incident light was obtained in the following manner. Transmittance and reflectance were measured by use of a spectro photometer (U4100 manufactured by Hitachi, Ltd.), and from these, the absorption/scattering amount was calculated. The absorption/scattering amount (%) was calculated as "100−(transmittance+reflectance)". FIG. 1 is a graph showing spectral distribution of reflectance of Examination Examples 1 to 11, FIG. 2 is a graph showing spectral distribution of transmittance of Examination Examples 1 to 11, and FIG. 3 is a graph showing spectral distribution of absorption/scattering amount of Examination Examples 1 to 11 and the generic product.

Figure 4:
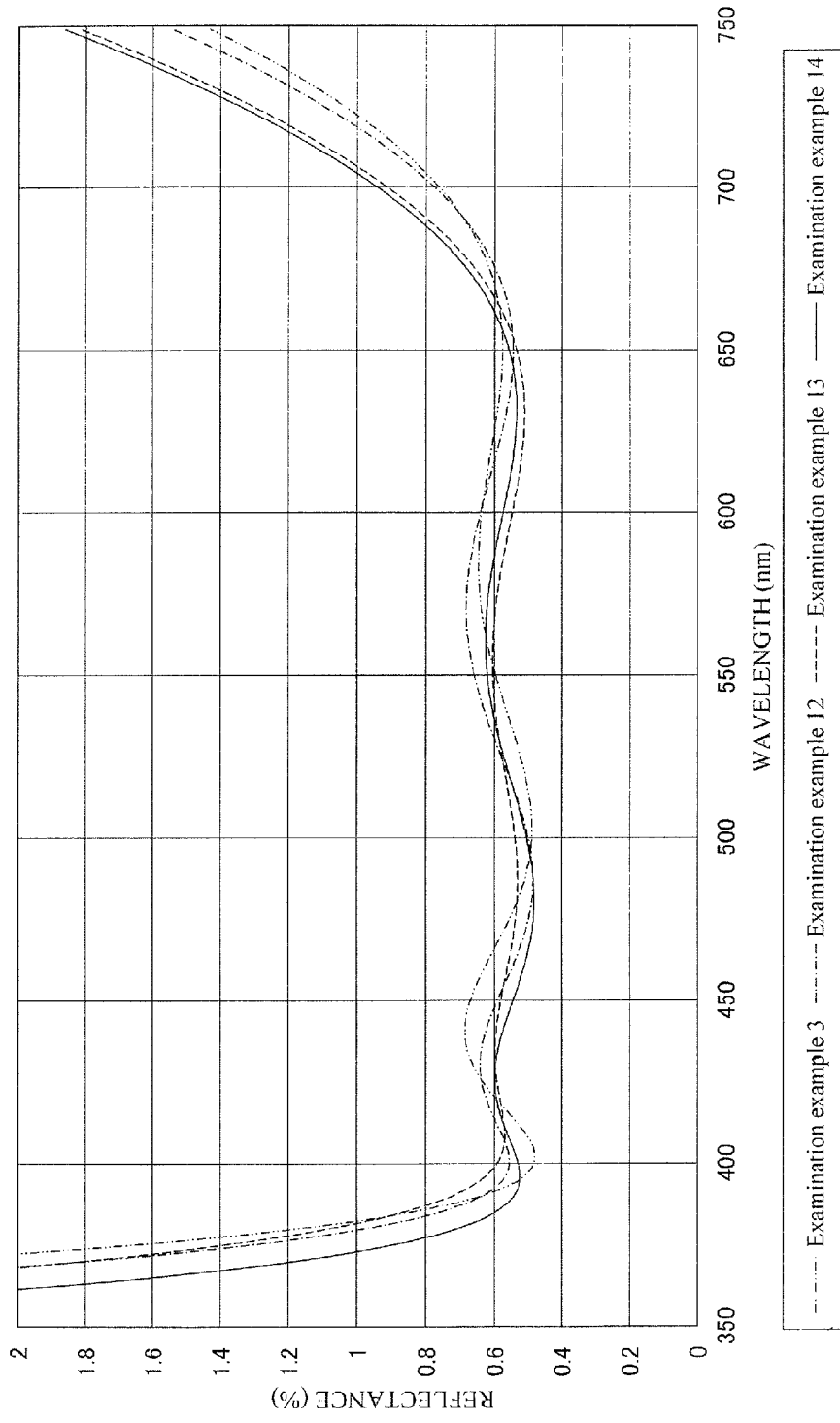
FIG. 4 is a graph showing spectral reflectance distribution of Examination Examples 3, and 12 to 14.

With respect to Examination Examples 3, and 12 to 14 whose ITO film thickness was 3 nm, whether there was difference among spectral reflectance distributions due to difference in arrangement positions of the ITO film was examined. The spectral reflectance distribution was measured by used of the spectro photometer, in a similar manner to the above. The results are shown in FIG. 4.

In addition, with respect to Examination Examples 1 to 17 and the generic product, antistatic property was examined in the following manner. That is, the charge potential of a surface of each of Examination Examples 1 to 17 and the generic product was measured as an initial potential by use of a static electricity measuring apparatus (FMX-003 manufactured by SIMCO JAPAN). Then, the surface was rubbed with a non-woven fabric (pure leaf manufactured by Ozu Corporation) for 10 seconds, and the charge potential of the surface was measured immediately after the rubbing, at 30 seconds after the rubbing, and 60 seconds after the rubbing. Moreover, in an adhesion test, the surface was rubbed for 10 seconds with a nonwoven fabric in a similar manner, and then immediately thereafter, the surface was placed close to expanded polystyrene powder, to observe adhesion of expanded polystyrene powder to the surface, thereby confirming the level of electrostatic charge (adhesion of expanded polystyrene powder indicates electrostatic charge). Table 2 below shows the results regarding Examination Examples 1 to 14, and Table 3 below shows the results regarding Examination Examples 15 to 17.

TABLE 2

|  |  | Examination Example 1 (ITO 1 nm) | Examination Example 2 (ITO 2 nm) | Examination Examples 3 to 11 (ITO 3 to 10 nm, 20 nm) | Examination Examples 12 to 14 | Generic Product |
|---|---|---|---|---|---|---|
| Charge potential [kV] | Initial | 0 | 0 | 0 | 0 | 0 |
|  | Immediately after rubbing | 0.5 | 0.7 | 0 | 0 | 0.7 |
|  | After 30 seconds | 0.3 | 0.3 | 0 | 0 | 0.4 |
|  | After 1 minute | 0.2 | 0.3 | 0 | 0 | 0.3 |
| Adhesion of expanded polystyrene |  | x | x | ○ | ○ | x |
| Antistatic property |  | x | x | ○ | ○ | x |

TABLE 3

|  |  | Examination Example 15 | Examination Example 16 | Examination Example 17 |
|---|---|---|---|---|
| Charge potential | Initial | 0.0 KV | 0.0 KV | 0.0 KV |
|  | Immediately after rubbing | 0.0 KV | 0.7 KV | 0.0 KV |
|  | 30 sec | 0.0 KV | 0.3 KV | 0.0 KV |
|  | 60 sec | 0.0 KV | 0.3 KV | 0.0 KV |
| Expanded polystyrene |  | ○ | x | ○ |
| Antistatic property |  | ○ | x | ○ |

First, absorption and the like will be examined.

As shown in FIG. 3, in particular, in the vicinity of a visible region, the absorption amount is large on the short wavelength side. At the wavelength of 430 nm, in Examination Examples 8 to 11 and the generic product, the absorption amount exceeds 0.5%. In contrast, in Examination Examples 1 to 7, the absorption amount is not higher than 0.5%.

Here, from the view point of realizing good optical performance for incident light by reducing the absorption amount thereof (letting incident light pass as much as possible), the results are examined. In an optical product, especially in a camera filter, the absorption amount being small in a wavelength region of 430 to 680 nm serves as one index for optical performance.

This means that Examination Examples 8 to 11 and the generic product are not preferable because of their optical performance at conventional levels. On the other hand, Examination Examples 1 to 7 exhibit high optical performance and thus, they are good.

Therefore, Examination Examples 8 to 11 do not belong to the present invention and correspond to Comparative Examples.

As shown in FIG. 4, even when the ITO film is at the third layer (Examination Example 3), at the fifth layer (Examination Example 12), at the seventh layer (Examination Example 13), or at the ninth layer (Examination Example 14), spectral reflectance distribution does not vary very much. Any of these Examination Examples has a very low reflectance of 0.6% in the wavelength region of 400 to 650 nm. Therefore, the optical performance does not vary very much due to the arrangement position of the ITO film, and by setting the thickness of the ITO film to be 3 nm, an excellent optical performance can be provided in any of Examination Examples 3 and 12 to 14.

Next, antistatic property will be examined.

As shown in Table 2, in Examination Example 1, immediately after the rubbing, a charge potential was 0.5 kV and even after 1 minute, a charge potential of about 0.2 kV remained. Moreover, in Examination Example 1, expanded polystyrene powder adhered ("x" in Table 2). In addition, also in Examination Example 2, as in the ease of Examination Example 1, occurrence of a charge potential and adhesion of expanded polystyrene powder due to the rubbing were observed. Therefore, Examination Examples 1 and 2 can be evaluated as not having antistatic performance ("x" in Table 2) and can be evaluated as corresponding to Comparative Examples.

In contrast, in Examination Examples 3 to 14, rubbing of the surface caused no charge potential, and expanded polystyrene powder did not adhere ("○" in Table 2). Therefore, Examination Examples 3 to 14 can be evaluated as having an antistatic function ("○" in Table 2).

Each of Examination Examples 1 and 2 includes the ITO film, being the conductive transparent film, that has a physical thickness of 1 or 2 nm, and thus, cannot exhibit an antistatic function because of an insufficient volume of the ITO film. On the other hand, each of Examination Examples 3 to 14 includes the ITO film, being the conductive transparent film, that has a sufficient thickness, and thus, can cancel static electricity and can exhibit an antistatic function.

Since the physical thickness of the ITO film is on the order of nanometer, the lower limit thereof needs to be further examined, and thus, Examination Examples 15 to 17 are examined.

Then, as shown in Table 3, in Examination Example 16 in which the physical thickness of the ITO film was 2 nm, a charge potential due to the rubbing occurred (0.7 kV immediately after the rubbing, and 0.3 kV even after 60 seconds), and expanded polystyrene adhered. This means that Examination Example 16 did not have antistatic performance.

On the other hand, in Examination Examples 15 and 17 in which the physical thickness of the ITO film was 3 nm, no charge potential and no adhesion due to the rubbing were observed, and thus, Examination Examples 15 and 17 had an antistatic function. Examination Example 15 had the ITO film at the seventh layer (on the outer layer side, at the second layer from the outermost layer), whereas Examination Example 17 had the ITO film at the first layer (on the substrate side, at the eighth layer from the outermost layer). Thus, it can be said that an antistatic function can be exhibited regardless of the arrangement position of the ITO in the multilayer film.

From the above, the following can be said from the view point of realizing both optical performance and an antistatic function.

That is, Examination Examples 1 and 2 each have an insufficient antistatic function, and thus, become Comparative Examples A and B, respectively. Examination Examples 8 to 11 each have an insufficient optical performance (the absorption amount is large), and thus become Comparative Examples C to F, respectively.

Examination Example 16 has a thin ITO film having a physical thickness of 2 nm, and thus has an insufficient antistatic function, and therefore becomes Comparative Example G.

On the other hand, Examination Examples 3 to 7 each have an antistatic function and an excellent optical performance, and thus, become Examples A to E, respectively. Similarly, Examination Examples 12 to 14, 15, and 17 become Examples F to H, I, and J, respectively.

In other words, as in the case of Examples A to J, when the physical thickness of the ITO film is 3 to 7 nm, irrespective of the position thereof in the multilayer film, an excellent antistatic function and an excellent optical performance can both be realized.

Moreover, Examples A to J each have a thin film thickness, which require less material amount and less film forming time. Therefore, Examples A to J can be formed uniformly, and allow increased degree of freedom in design.

Example 1

As an optical product according to Example 1, an optical product was prepared in which a multilayer film shown in Table 4 below was formed on one face of the same substrate as used in Examination Example 1 and the like.

gas was introduced by an amount that made the degree of vacuum a set value ($5.0 \times 10^{-3}$ Pa).

The film forming rate of the $MgF_2$ film was controlled by the current being maintained at a set value.

The fluorine-based resin film was formed in the following manner. The substrate on which antireflection films had been already formed was subjected to water repellent treatment by a vacuum deposition method. As a water repellent, an organosilicon compound (KY-8 manufactured by Shin-Etsu Chemical Co., Ltd.) was used to form a thin film layer.

Example 2

As an optical product according to Example 2, an optical product was prepared which was similar to that of Example 1, but in which, as shown in Table 4, the ITO film was positioned at the seventh layer, the $TiO_2$ film was positioned at the sixth layer, and the thicknesses of the dielectric films were slightly adjusted while the thicknesses of the ITO film, the $SiO_2$ film, and the fluorine-based resin film were maintained.

It should be noted that, during vacuum deposition of the ITO film, ion-assist was performed. That is, the ITO film was formed by IAD. Here, ionized Ar gas was used, the acceleration voltage and current were 100V and 600 mA, and the bias current was 1000 mA. In addition, $O_2$ gas was introduced.

TABLE 4

| Layer | Example 1 | | Example 2 | | Example 3 | | Example 4 | | Example 5 | | Example 6 | | Example 7 | |
|---|---|---|---|---|---|---|---|---|---|---|---|---|---|---|
| 1 | Al2O3 | 74.0 nm | Al2O3 | 66.0 nm | Al2O3 | 74.0 nm | Al2O3 | 74.0 nm | Al2O3 | 74.0 nm | Al2O3 | 74.0 nm | ITO | 5.0 nm |
| 2 | TiO2 | 16.0 nm | TiO2 | 15.0 nm | TiO2 | 16.0 nm | TiO2 | 16.0 nm | TiO2 | 14.0 nm | ITO | 5.0 nm | Al2O3 | 53.0 nm |
| 3 | Al2O3 | 24.5 nm | Al2O3 | 19.0 nm | Al2O3 | 24.5 nm | Al2O3 | 23.0 nm | ITO | 5.0 nm | TiO2 | 13.0 nm | TiO2 | 17.0 nm |
| 4 | TiO2 | 64.0 nm | TiO2 | 61.0 nm | TiO2 | 57.0 nm | ITO | 5.0 nm | Al2O3 | 22.0 nm | Al2O3 | 24.5 nm | Al2O3 | 21.0 nm |
| 5 | Al2O3 | 14.0 nm | Al2O3 | 15.0 nm | ITO | 5.0 nm | TiO2 | 63.0 nm | TiO2 | 64.0 nm | TiO2 | 64.0 nm | TiO2 | 64.0 nm |
| 6 | ITO | 5.0 nm | TiO2 | 21.5 nm | Al2O3 | 15.0 nm | Al2O3 | 16.0 nm | Al2O3 | 16.0 nm | Al2O3 | 16.0 nm | Al2O3 | 15.0 nm |
| 7 | TiO2 | 24.0 nm | ITO (IAD) | 5.0 nm | TiO2 | 27.5 nm | TiO2 | 27.5 nm | TiO2 | 27.5 nm | TiO2 | 27.5 nm | TiO2 | 26.0 nm |
| 8 | MgF2 | 95.0 nm | MgF2 | 95.0 nm | MgF2 | 97.0 nm | MgF2 | 97.0 nm | MgF2 | 97.0 nm | MgF2 | 97.0 nm | MgF2 | 96.0 nm |
| 9 | SiO2 | 5.0 nm | SiO2 | 5.0 nm | SiO2 | 5.0 nm | SiO2 | 5.0 nm | SiO2 | 5.0 nm | SiO2 | 5.0 nm | SiO2 | 5.0 nm |
| 10 | Fluoro-resin | 5 nm | Fluoro-resin | 5 nm | Fluoro-resin | 5 nm | Fluoro-resin | 5 nm | Fluoro-resin | 5 nm | Fluoro-resin | 5 nm | Fluoro-resin | 5 nm |

In the multilayer film, among dielectric films of two types (the first to fifth and seventh layers counted from the substrate) alternately arranged on the substrate, between the fifth layer and the seventh layer, a transparent conductive film was inserted as the sixth layer, and on further outside thereof, a $MgF_2$ film (the eighth layer) was arranged. Further, via a $SiO_2$ film (the ninth layer), a fluorine-based resin film (the tenth layer, the outermost layer) was arranged. The physical thickness of each layer is shown in Table 4.

Among the dielectric films, odd-numbered layers including the layer in contact with the substrate were made of $Al_2O_3$ as an intermediate refractive index material, and the layers arranged therebetween and the layer outside the transparent conductive film were made of $TiO_2$ as a high refractive index material. In consideration that if the $MgF_2$ film is arranged adjacent to the fluorine-based resin film, adhesion therebetween is not good, and in consideration that if a conductive film is inserted therebetween, adhesion can be secured, a $SiO_2$ film was arranged between the $MgF_2$ film and the fluorine-based resin film.

It should be noted that the transparent conductive film was made of ITO and the physical thickness thereof was 5.0 nm.

The various types of films were all formed by a vacuum deposition method. Except for the $MgF_2$ film, the $SiO_2$ film, and the fluorine-based resin film, during vapor deposition, $O_2$ Examples 3 to 7

As optical products according to Examples 3 to 7, optical products were prepared that were similar to that of Example 1, but in which, as shown in Table 4, the positions of the ITO film were varied, and the thicknesses of the dielectric films and the $MgF_2$ film were slightly adjusted.

The ITO film of Example 3 was at the fifth layer, the ITO film of Example 4 was at the fourth layer, the ITO film of Example 5 was at the third layer, the ITO film of Example 6 was at the second layer, and the ITO film of Example 7 was at the first layer (directly above the substrate).

Examples 8 and 9

As optical products according to Examples 8 and 9, optical products having the same film configuration, including the film thicknesses, as the film configuration of Example 2 were prepared, with the IAD condition varied as follows.

Example 8: acceleration voltage 700V, acceleration current 900 mA, bias current 1000 mA Example 9: acceleration voltage 300V, acceleration current 600 mA, bias current 1000 mA

Comparative Example 1

As an optical product according to Comparative Example 1, an optical product was prepared in which a multilayer film shown in Table 5 below was formed on one face of the same substrate as used in Example 1. The configuration of Comparative Example 1 was equivalent to that of Example 1 without the ITO film and with the thicknesses of the dielectric films and the $MgF_2$ film slightly adjusted.

TABLE 5

| Layer | Comparative Example 1 | | Comparative Example 2 | | Comparative Example 3 | |
|---|---|---|---|---|---|---|
| 1 | Al2O3 | 74.0 nm | Al2O3 | 74.0 nm | Al2O3 | 74.0 nm |
| 2 | TiO2 | 16.0 nm | TiO2 | 16.0 nm | TiO2 | 16.0 nm |
| 3 | Al2O3 | 24.5 nm | Al2O3 | 24.5 nm | Al2O3 | 24.5 nm |
| 4 | TiO2 | 64.0 nm | TiO2 | 64.0 nm | TiO2 | 64.0 nm |
| 5 | Al2O3 | 16.0 nm | Al2O3 | 16.0 nm | Al2O3 | 16.0 nm |
| 6 | TiO2 | 27.5 nm | TiO2 | 24.0 nm | TiO2 | 24.0 nm |
| 7 | MgF2 | 97.0 nm | ITO | 5.0 nm | ITO | 30.0 nm |
| 8 | SiO2 | 5.0 nm | MgF2 | 95.0 nm | MgF2 | 95.0 nm |
| 9 | Fluororesin | 5 nm | SiO2 | 5.0 nm | SiO2 | 5.0 nm |
| 10 | None | None | Fluororesin | 5 nm | Fluororesin | 5 nm |

Comparative Example 2 and 3

As an optical product according to Comparative Example 2, an optical product was prepared which was similar to that of Example 2, but in which, as shown in Table 5, ion-assist was not performed during vapor deposition of the ITO film.

As an optical product according to Comparative Example 3, an optical product was prepared which was similar to that of Comparative Example 2, but in which, as shown in Table 5, the thickness of the ITO film was 30 nm, not 5 nm.

Examination of Examples 1 to 9 and Comparative Examples 1 to 3

Figure 5:
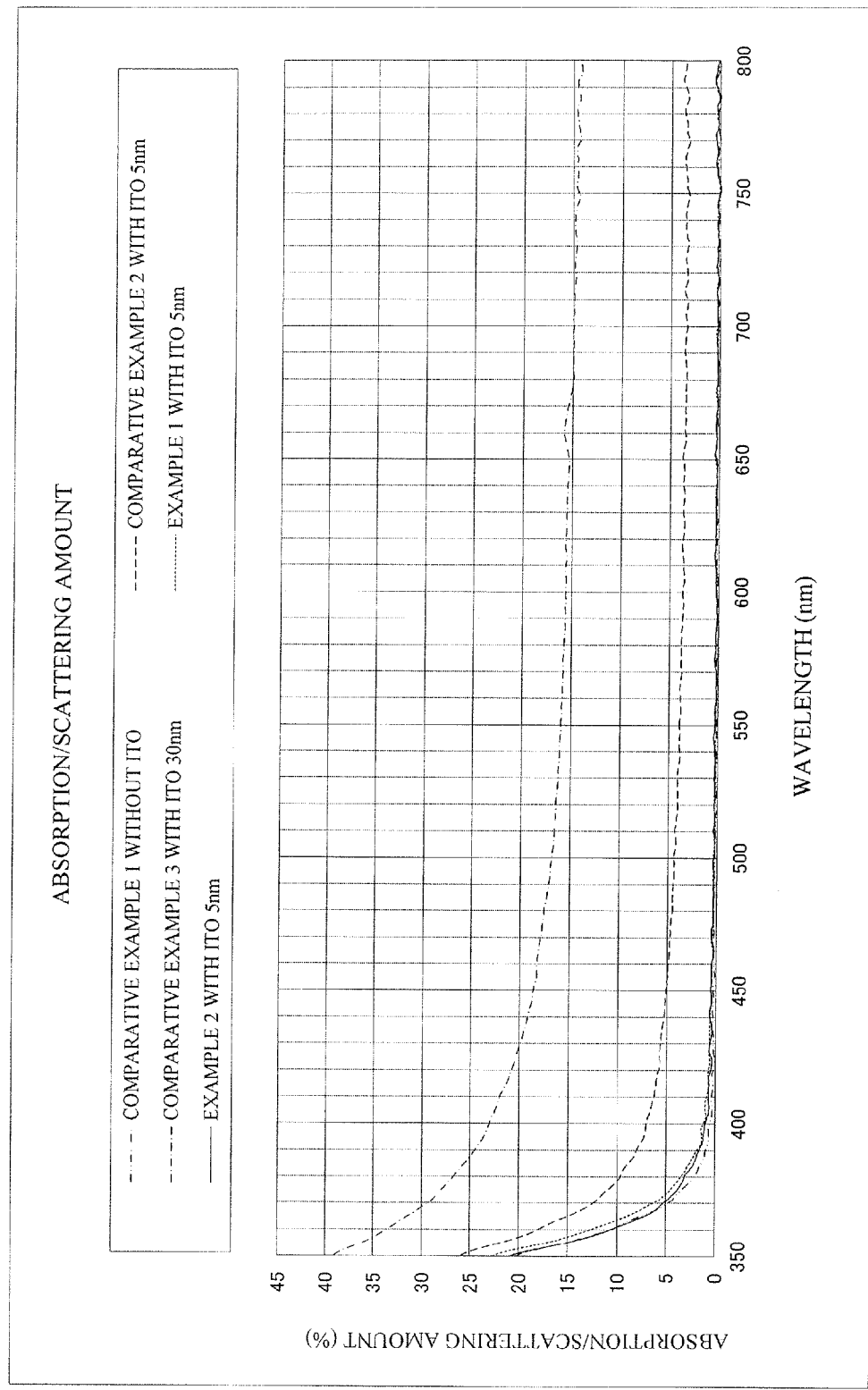
FIG. 5 is a graph showing spectral distribution of absorption/scattering amount of Examples 1 and 2 and Comparative Examples 1 to 3.
Figure 6:
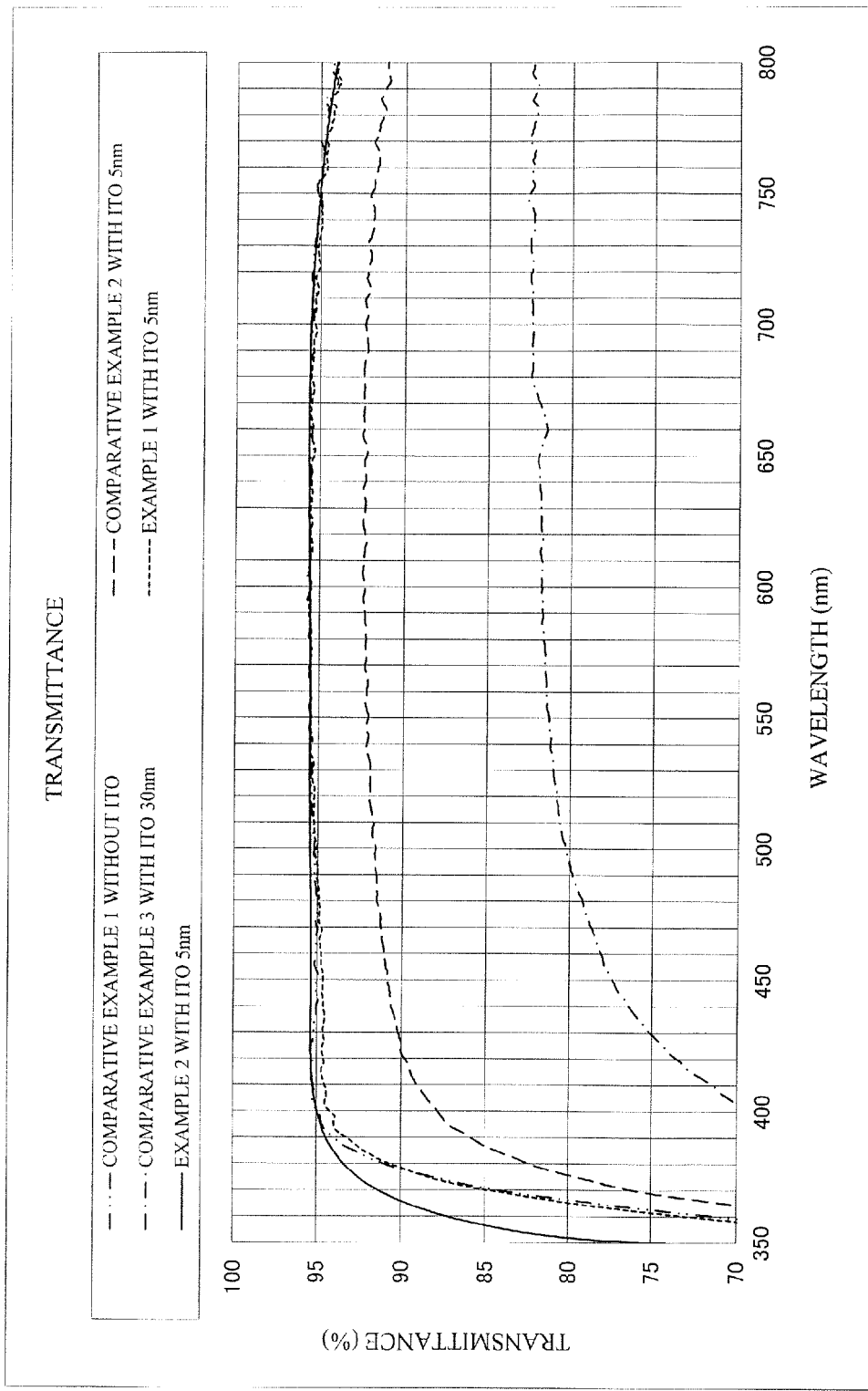
FIG. 6 is a graph showing spectral distribution of transmittance of Examples 1 and 2 and Comparative Examples 1 to 3.

With respect to Examples 1 and 2 and Comparative Examples 1 to 3, the absorption/scattering amount of incident light was obtained in the following manner. Transmittance and reflectance were measured by use of a spectro photometer (U4100 manufactured by Hitachi, Ltd.), and from these, the absorption/scattering amount was calculated. FIG. 5 is a graph showing spectral distribution of absorption/scattering amount, and FIG. 6 is a graph showing spectral distribution of transmittance.

Figure 7:
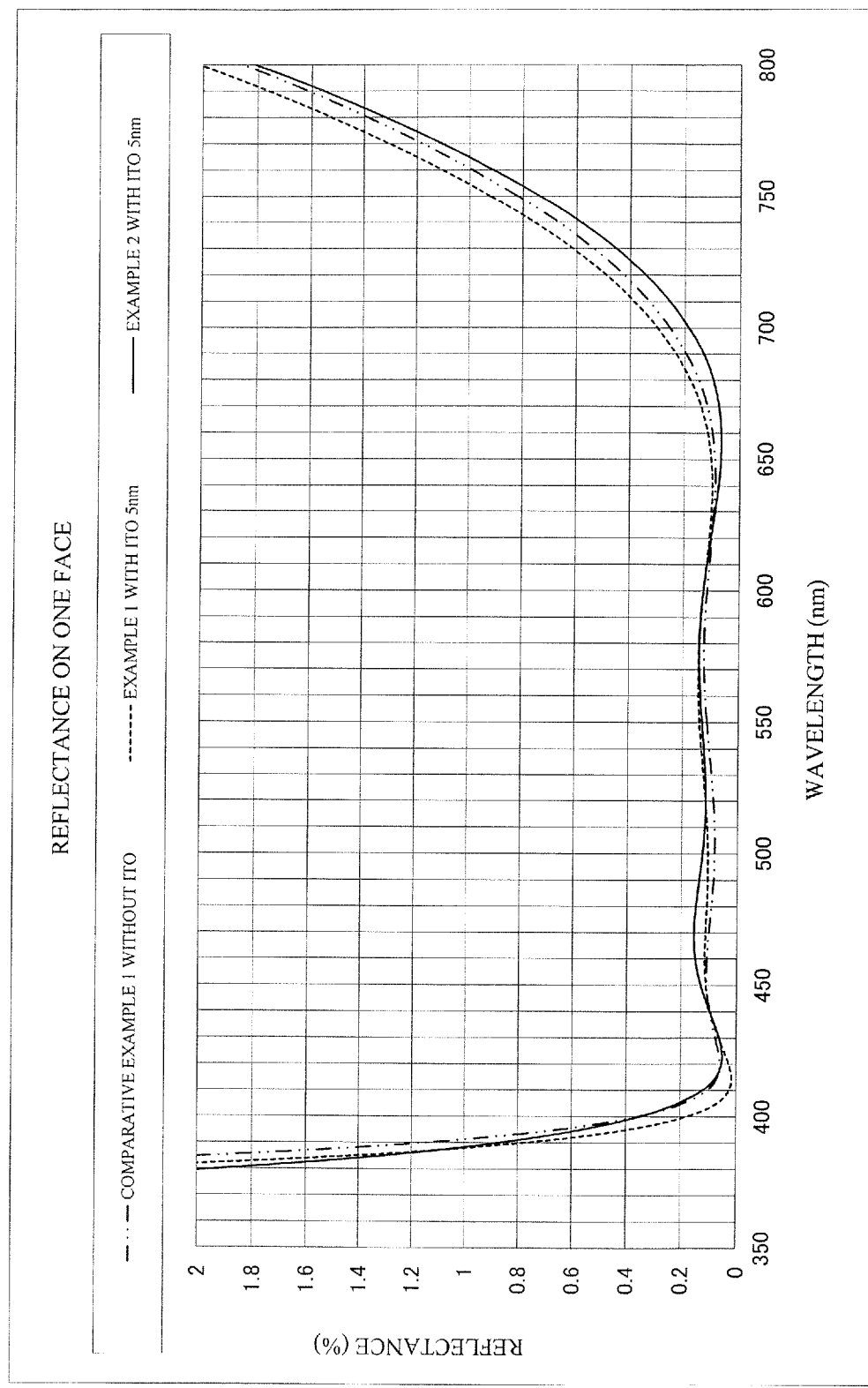
FIG. 7 is a graph showing spectral distribution of reflectance on one face of Examples 1 and 2 and Comparative Example 1.

Moreover, with respect to Examples 1 and 2 and Comparative Example 1, reflectance on one face was measured by use of a spectro photometer (USPM-RUIII manufactured by OLYMPUS CORPORATION). FIG. 7 is a graph showing spectral distribution of reflectance on one face.

With respect to Examples 1 and 2 and Comparative Examples 1 to 3, the haze value (HAZE) was measured by use of a turbidity meter (NDH5000 manufactured by NIPPON DENSHOKU INDUSTRIES Co. Ltd.). The results are shown in Table 6 below. In Table 6, T.T represents total light transmittance, P.T represents parallel transmittance, and DIF represents diffuse transmittance.

In addition, with reference to Examples 1 to 9 and Comparative Examples 1 and 2, antistatic property was examined in the following manner. The charge potential of a surface of each of Examples 1 to 9 and Comparative Examples 1 and 2 was measured as an initial potential by a static electricity measuring apparatus (FMX-003 manufactured by SIMCO JAPAN). Then, the surface was rubbed with a nonwoven fabric (pure leaf manufactured by Ozu Corporation) for 10 seconds, and the charge potential of the surface was measured immediately after the rubbing, at 30 seconds after the rubbing, and 60 seconds after the rubbing. Moreover, in an adhesion test, the surface was rubbed for 10 seconds with a nonwoven fabric in a similar manner, and then immediately thereafter, the surface was placed close to expanded polystyrene powder, to observe adhesion of expanded polystyrene powder to the surface, thereby confirming the level of electrostatic charge (adhesion of expanded polystyrene powder indicates electrostatic charge). The results are shown in Table 7 below.

TABLE 6

| | T.T | HAZE | P.T | DIF |
|---|---|---|---|---|
| Without ITO Comparative Example 1 | 95.48 | 0.12 | 95.37 | 0.11 |
| ITO 5 nm Comparative Example 2 | 93.38 | 1.57 | 91.91 | 1.47 |
| ITO 30 nm Comparative Example 3 | 86.54 | 6.47 | 80.94 | 5.60 |
| ITO 5 nm Example 1 | 95.36 | 0.09 | 95.27 | 0.09 |
| ITO 5 nm Example 2 | 95.43 | 0.10 | 95.33 | 0.10 |

TABLE 7

| | Configuration | Comparative Example 1 | Comparative Example 2 | Example 1 | Example 2 | Example 3 | Example 4 | Example 5 | Example 6 | Example 7 | Example 8 | Example 9 |
|---|---|---|---|---|---|---|---|---|---|---|---|---|
| Charge potential [kV] | Initial | 0 | 0 | 0 | 0 | 0 | 0 | 0 | 0 | 0 | 0 | 0 |
| | Immediately after rubbing | 0.7 | 0 | 0 | 0 | 0 | 0 | 0 | 0 | 0 | 0 | 0 |
| | After 30 seconds | 0.6 | 0 | 0 | 0 | 0 | 0 | 0 | 0 | 0 | 0 | 0 |
| | After 1 minute | 0.5 | 0 | 0 | 0 | 0 | 0 | 0 | 0 | 0 | 0 | 0 |

TABLE 7-continued

| Configuration | Comparative Example 1 | Comparative Example 2 | Example 1 | Example 2 | Example 3 | Example 4 | Example 5 | Example 6 | Example 7 | Example 8 | Example 9 |
|---|---|---|---|---|---|---|---|---|---|---|---|
| Adhesion of expanded polystyrene | x | ○ | ○ | ○ | ○ | ○ | ○ | ○ | ○ | ○ | ○ |
| Antistatic property | x | ○ | ○ | ○ | ○ | ○ | ○ | ○ | ○ | ○ | ○ |

First, absorption and scattering will be examined.

In Examples 1 and 2, in the entire visible region, the absorption/scattering amount is substantially 0% (FIG. 5), and the transmittance is stable at about 95% (FIG. 6). In contrast, in Comparative Examples 2 and 3, in the entire visible region, the absorption/scattering amount is increased and the transmittance is decreased.

The reason for this is as follows. In Example 1, the $TiO_2$ film was inserted between the $MgF_2$ film and the ITO film, and in Example 2, the ITO film adjacent to the $MgF_2$ film was formed by IAD. In contrast, in Comparative Examples 2 and 3, the $MgF_2$ film was simply positioned adjacent to the ITO film not formed by IAD. When the $MgF_2$ film and the ITO film not formed by IAD are adjacent to each other, interaction therebetween causes occurrence of fine granular portions and opaque portions.

Moreover, as shown in Table 6, with respect to haze values (HAZE), Examples 1 and 2 have low values of 0.09 to 0.10, whereas Comparative Examples 2 and 3 have relatively high values of 1.57 to 6.47. This reason supports occurrence of scattering in Comparative Examples 2 and 3.

It should be noted that Examples 1 and 2 show absorption, scattering, transmittance, and haze values similar to those of Comparative Example 1 not having the ITO film.

FIG. 7 shows that, by use of the $MgF_2$ film being the low refractive index, and the like, Examples 1 and 2 (and Comparative Example 1) have become extremely low reflection films exhibiting very low reflectance, where in the wavelength region of 410 to 680 nm, the reflectance on one face is not higher than 0.2%.

Next, antistatic property will be examined.

In Comparative Example 1, immediately after the rubbing, a charge potential was 0.7 kV, and even after 1 minute, a charge potential of about 0.5 kV remained. Further, expanded polystyrene powder adhered ("x" in Table 7). Therefore, Comparative Example 1 can be evaluated as not having antistatic performance ("x" in Table 7).

In contrast, in Examples 1 to 9 (and Comparative Example 2), rubbing of the surface caused no charge potential, and expanded polystyrene powder did not adhere ("○" in Table 7). Therefore, Examples 1 to 9 (and Comparative Example 2) can be evaluated as having an antistatic function ("○" in Table 7).

Comparative Example 1 does not include the ITO film being the conductive transparent film, and thus, cannot exhibit an antistatic function. On the other hand, each of Examples 1 to 9 (and Comparative Examples 2 and 3) includes the ITO film being the conductive transparent film, and thus, can cancel static electricity and thus can exhibit an antistatic function.

Examples 1 to 7 have the ITO films at different positions from each other, but exhibit an antistatic function none the less. In addition, Examples 2, 8, and 9, which each have the ITO film adjacent to the $MgF_2$ film but have different IAD conditions from each other, exhibit an antistatic function none the less. Therefore, from the view point of providing an antistatic function, the position of the ITO film and the IAD condition need not be taken into consideration. When taking into consideration prevention of scattering described above, the ITO film should be positioned not adjacent to the $MgF_2$ film, or the ITO film should be formed by IAD and positioned adjacent to the $MgF_2$ film. It should be noted that optical performance of each of Examples 3 to 9 was similar to that of Examples 1 and 2. Further, when the ITO film is not positioned adjacent to the $MgF_2$ film, the ITO film may be formed by IAD.

From the above, by using the $MgF_2$ film and the ITO film not positioned adjacent to each other (Examples 1 and 3 to 7), or by forming the ITO film by IAD i.e., by ion-assisted process (to be positioned adjacent to each other) (Examples 2, 8, and 9), it becomes possible to provide an optical product having both an extremely low reflection function and an antistatic function.

Example 10

As an optical product according to Example 10, an optical product was prepared which was similar to that of Example 1, but in which, as shown below, the ITO film was positioned at the fifth layer, and $Al_2O_3$, $ZrO_2$, $MgF_2$, $SiO_2$, and fluorine-based resin were also used. The layer on the substrate side (the layer directly above the substrate) was the first layer. The layer configuration of Example 10 is as shown below.

(substrate/) $Al_2O_3$ film/$ZrO_2$ film/$MgF_2$ film/$ZrO_2$ film/ITO film (3 nm)/$SiO_2$ film/$MgF_2$ film/$SiO_2$ film/fluorine-based resin film (antifouling film)

Example 11

As an optical product according to Example 11, an optical product was prepared which was similar to that of Example 1, but in which, as shown below, the ITO film was positioned at the second layer, and $SiO_2$, $La_2Ti_2O_7$ (lanthanum titanate, OH14 manufactured by Canon Optron. Inc.), $Al_2O_3$, $ZrO_2$, $MgF_2$, and fluorine-based resin were also used. The layer on the substrate side (the layer directly above the substrate) was the first layer. The layer configuration of Example 11 is as shown below.

(substrate/) $SiO_2$ film/ITO film (3 nm)/$SiO_2$ film/$La_2Ti_2O_7$ film/$MgF_2$ film/$La_2Ti_2O_7$ film/$MgF_2$ film/$SiO_2$ film/fluorine-based resin film

Example 12

As an optical product according to Example 12, an optical product was prepared which was similar to that of Example 10, but in which, as shown below, the sixth layer was made of $ZrO_2$. The layer on the substrate side (the layer directly above the substrate) was the first layer. The layer configuration of Example 12 is as shown below.

(substrate/) $Al_2O_3$ film/$ZrO_2$ film/$MgF_2$ film/$ZrO_2$ film/ITO film (3 nm)/$ZrO_2$ film/$MgF_2$ film/$SiO_2$ film/fluorine-based resin film

Example 13

As an optical product according to Example 13, an optical product was prepared which was similar to that of Example 12, but in which, as shown below, the ITO film was prepared by IAD. The layer on the substrate side (the layer directly above the substrate) was the first layer. The layer configuration of Example 13 is as shown below.

Figure 8:
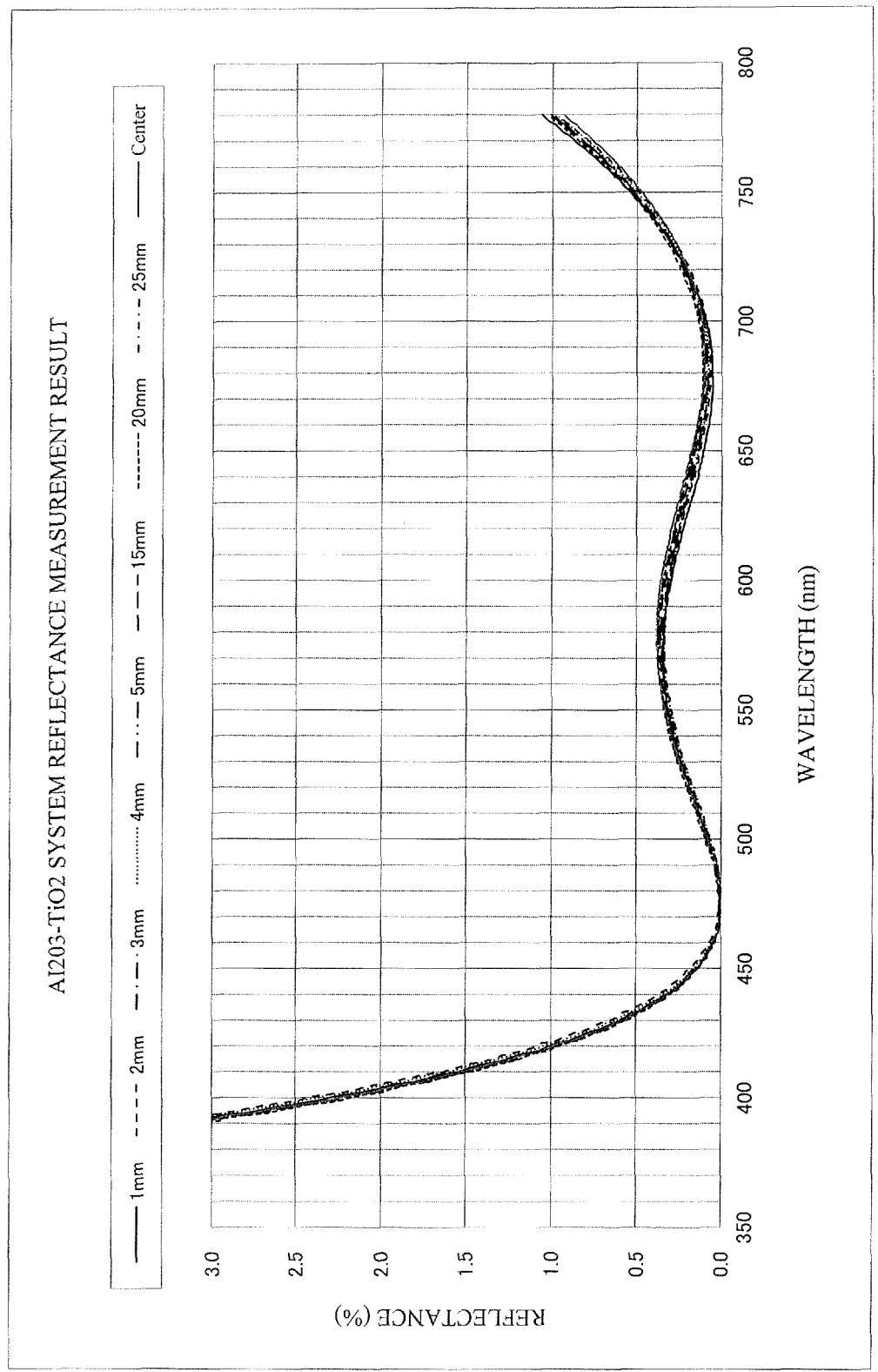
FIG. 8 is a graph showing spectral distribution of reflectance on one face of various types of multilayer films having a configuration similar to that of Example 3.
Figure 9:
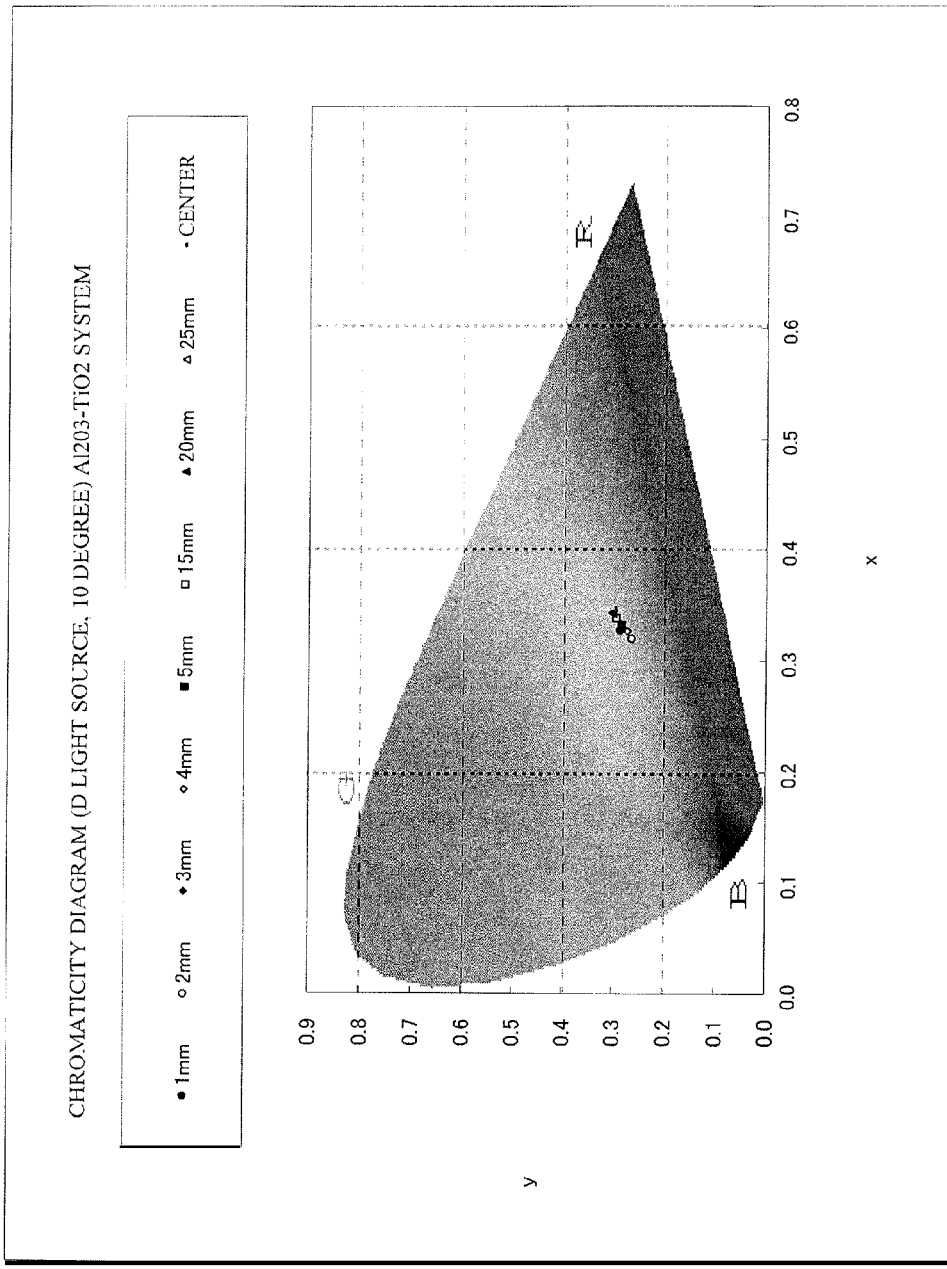
FIG. 9 is a chromaticity diagram (x, y, Y) of a CIE standard colorimetric system with respect to the various types of multilayer films in FIG. 8.

(substrate/) $Al_2O_3$ film/$ZrO_2$ film/$MgF_2$ film/$ZrO_2$ film/ITO film (3 nm, IAD)/$ZrO_2$ film/$MgF_2$ film/$SiO_2$ film/fluorine-based resin film Examination of Examples 10 to 13 and the Like Optical products that had the same film configuration as that of Example 3 but in which only the physical thicknesses of the ITO films were respectively changed to 1, 2, 3, 4, 5, 15, 20, and 25 nm (the optical product with the ITO film having a physical thickness of 5 nm was the same as that of Example 3) ($Al_2O_3$—$TiO_2$ system) were prepared. Then, their reflectance spectral distributions were measured respectively, and colors in a chromaticity diagram (x, y, Y) of a CIE standard colorimetric system were measured, respectively. FIG. 8 is a graph showing reflectance spectral distributions thereof, and FIG. 9 shows a chromaticity diagram thereof.

Figure 10:
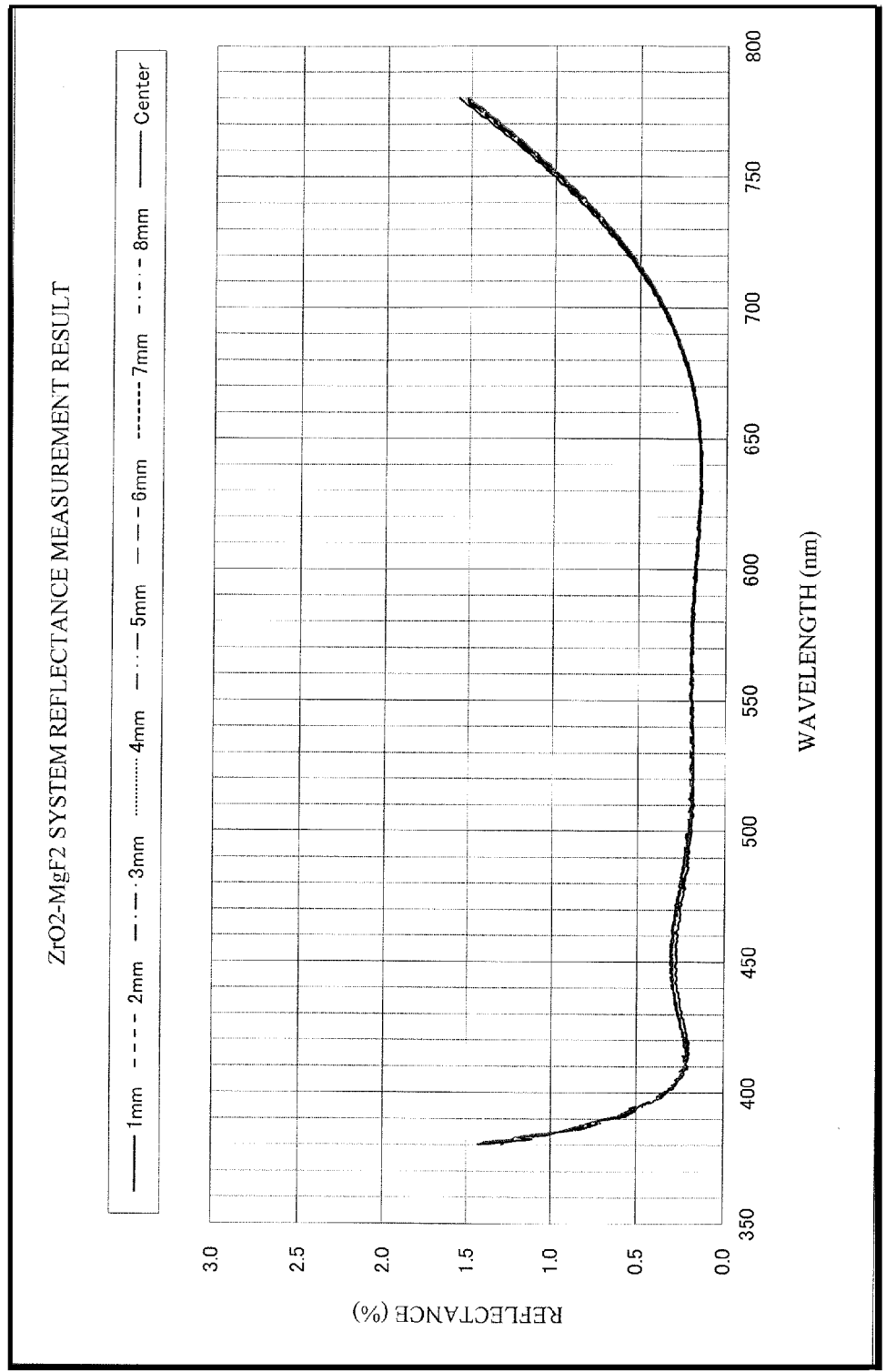
FIG. 10 is a graph showing spectral distribution of reflectance on one face of various types of multilayer films belonging to Example 13.
Figure 11:
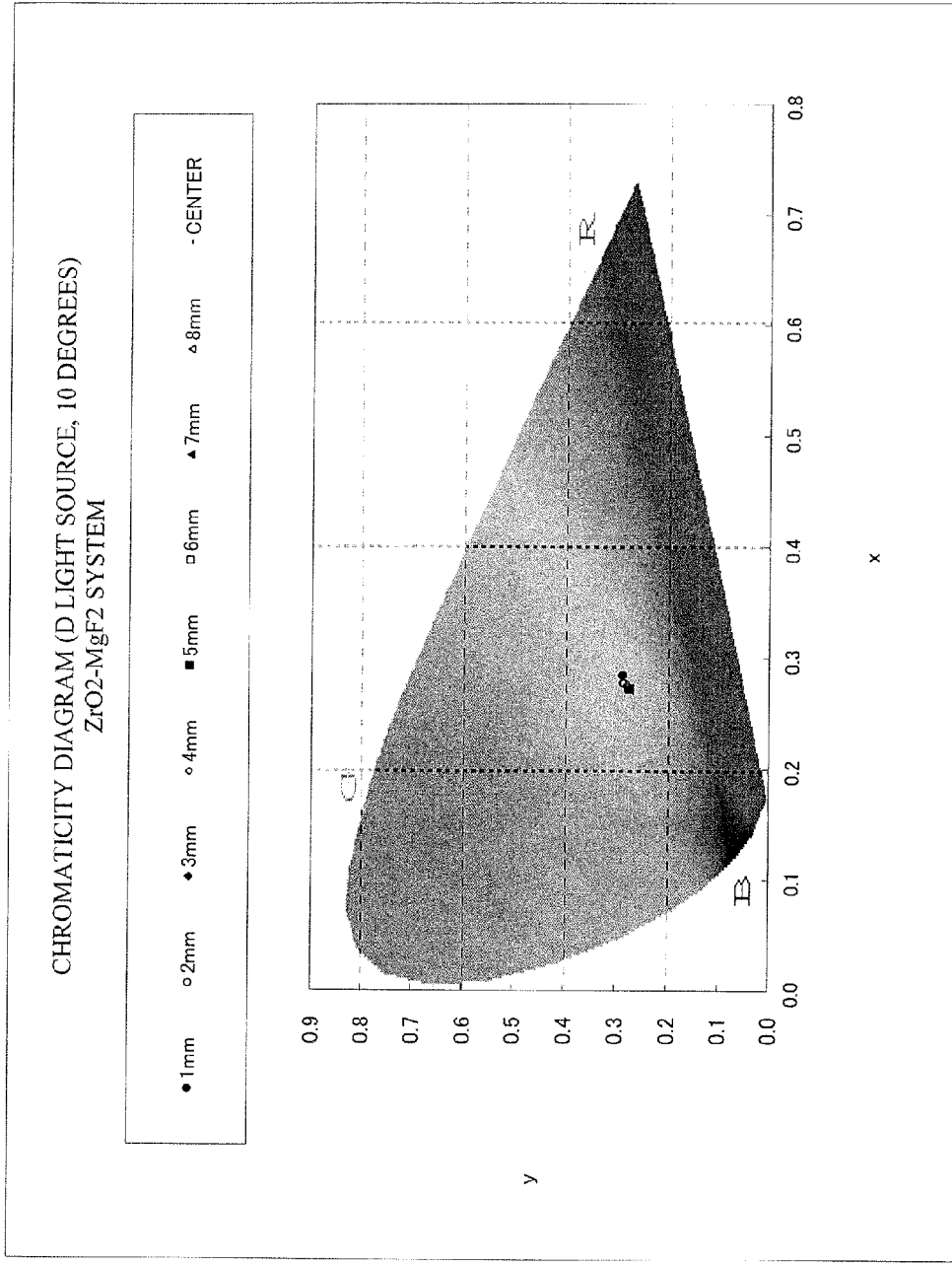
FIG. 11 is a chromaticity diagram (x, y, Y) of the CIE standard colorimetric system with respect to the various types of multilayer film in FIG. 10.

With respect to optical products that belong to Example 13 and in which the physical thicknesses of the ITO films were the same as those in the $Al_2O_3$—$TiO_2$ system above ($ZrO_2$—$MgF_2$ system), their reflectance spectral distributions were measured, respectively, and colors in the chromaticity diagram (x, y, Y) of the CIE standard colorimetric system were measured, respectively. FIG. 10 is a graph showing reflectance spectral distributions thereof, and FIG. 11 shows a chromaticity diagram thereof.

Moreover, with respect to an optical product similar to Example 3 described above (corresponding to Example 3) and Examples 10 to 13, various types of evaluations were performed, and results thereof are shown in Table 8 below.

sponding to Example 3 and Examples 10 to 13 was placed in an environment of temperature of 60 degrees and humidity of 95% for one day, three days, and seven days, in total, and changes of the lens were observed.

Next, evaluation regarding reflectance and smoothness will be described. Among the plurality of optical products corresponding to Example 3 that were prepared, some of them were found to have, through detailed observation, unevenness (A−) in the face having the multilayer film formed thereon as shown in FIG. 8 and FIG. 9, and although the color tones were stable to a certain degree, it can be said, by strict evaluation, that the color tones were not stable (A−). Moreover, smoothness on the face having the multilayer film formed thereon was slightly inferior (A−) due to the ITO film, the $Al_2O_3$ films, the $TiO_2$ films, the $MgF_2$ film (in particular, the ITO film and the $MgF_2$ film), when compared with a multilayer film not including the ITO film and the $MgF_2$ film and having good smoothness. The result regarding smoothness is considered to have been caused by the fact that it is relatively difficult to form the ITO film, the $MgF_2$ film, and the like into thin films having very low surface roughness. Evaluation of smoothness was conducted in such a manner that a plurality of persons having ordinary skills in the art examined the resistance (rough feel) they felt when they wiped the surface with a waste cloth, and their opinions were summarized.

In contrast, with respect to Example 10, the $MgF_2$ film was sandwiched by the $SiO_2$ films, whereby the surface roughness of the $MgF_2$ film could be absorbed by the $SiO_2$ films formable to have very smooth surfaces, and thus, smoothness was very good (A++). Moreover, unevenness and color tone satisfied a very high required level (equivalent to or higher than those of an optical product not including the ITO film and the $MgF_2$ film and being very smooth, A++). However, since two

TABLE 8

| | | | Water | Reflectance | | | | | |
| | Antistatic property | Smoothness | repellent property | Reflection characteristic | Unevenness in face | Color tone | Transmittance (absorption) | Strength (scratch) | Weather resistance |
|---|---|---|---|---|---|---|---|---|---|
| Corresponding to Example 3 | A++ | A− | A++ | A++ | A− | A− | A++ | A++ | A++ |
| Example 10 | A++ | A++ | A++ | A | A++ | A++ | A++ | A++ | A++ |
| Example 11 | A++ | A | A++ | A++ | A++ | A++ | A++ | A++ | A++ |
| Example 12 | A++ | A− | A++ | A++ | A++ | A++ | A++ | A++ | A++ |
| Example 13 | A++ | A++ | A++ | A++ | A++ | A++ | A++ | A++ | A++ |

First, with respect to antistatic property, water repellent property, transmittance (less absorption), scratch resistance, and weather resistance, all were very good (A++). That is, no electrostatic charge was observed, and water was sufficiently repelled, and the amount of absorption of transmitted light was sufficiently small, no scratch was observed, and no change was observed before and after a weathering test.

Antistatic property and transmittance were evaluated in the same manner as in Examples 1 to 9 described above.

As for water repellent property, pure water was dropped on a surface of each of the optical product corresponding to Example 3 and Examples 10 to 13, and the angle between the surface and the base portion of the surface of the pure water drop was evaluated. Scratch resistance (strength against scratch) was evaluated based on the presence/absence or the level of scratches when the surface was rubbed with a file having a predetermined roughness. Weather resistance was confirmed based on a constant temperature and humidity test (weathering test) in which each of the optical product correlayers of the $SiO_2$ films were respectively provided immediately above and immediately below the $MgF_2$ film, reflectance thereof was good but slightly below a high required level (A).

In Example 11, in order to realize good characteristics regarding reflectance, lanthanum titanate was used as the high refractive index material, and in order to realize good smoothness while maintaining characteristics regarding reflectance, the $SiO_2$ film immediately above which lanthanum titanate was used as the layer was arranged at the layer immediately above the ITO film. As a result, reflectance satisfied a high level, unevenness did not occur, and color tone was also good, whereby characteristics regarding reflectance became very good. Smoothness was good but did not satisfy a high required level (A).

In Example 12, in order to realize high levels of characteristics regarding reflectance and smoothness, the sixth layer (the layer immediately above the ITO film) of Example 10 was replaced with a $ZrO_2$ film. As a result, characteristics regarding reflectance became very good. Smoothness was good but was further slightly inferior to that of Example 11 (A).

In Example 13, in order to realize high levels of characteristics regarding reflectance and smoothness, the ITO film of Example 12 was subjected to IAD. As a result, characteristics regarding reflectance became very good, and smoothness became very good (see FIG. 10, FIG. 11).

Therefore, from the view point of realizing both characteristics regarding reflectance and smoothness in particular, while providing antistatic property, it is preferable that a $ZrO_2$ film is included. It is considered that the $ZrO_2$ film absorbs surface roughness of the ITO film and the $MgF_2$ film while maintaining good characteristics reflectance. Thus, it is preferable that the $ZrO_2$ film is included in any of the dielectric films on the surface side relative to the ITO film. Further, it is more preferable that the $ZrO_2$ film is on the surface side adjacent to the ITO film (directly above the ITO film). It is further preferable that the $ZrO_2$ film is provided directly above the ITO film and on the base material side adjacent to the ITO film (directly below the ITO film).

When the ITO film is formed by IAD, in addition to antistatic property, characteristics regarding reflectance and smoothness can also be made very good.

It is explicitly stated that all features disclosed in the description and/or the claims are intended to be disclosed separately and independently from each other for the purpose of original disclosure as well as for the purpose of restricting the claimed invention independent of the composition of the features in the embodiments and/or the claims. It is explicitly stated that all value ranges or indications of groups of entities disclose every possible intermediate value or intermediate entity for the purpose of original disclosure as well as for the purpose of restricting the claimed invention, in particular as limits of value ranges.

What is claimed is:

1. An optical product comprising:
    a transparent base material; and
    a multilayer film including a dielectric film and an ITO film, the multilayer film being formed on one face or two faces of the transparent base material;
    wherein the dielectric film on a surface side relative to the ITO film includes a $ZrO_2$ film;
    wherein the $ZrO_2$ film is arranged directly above and directly below the ITO film; and
    wherein a physical thickness of the ITO film is not less than 3 nanometers and not greater than 7 nanometers.

2. The optical product according to claim 1, wherein the dielectric film also includes a $MgF_2$ film, and
    the ITO film and the $MgF_2$ film are arranged so as not to be adjacent to each other.

3. The optical product according to claim 2, wherein
    when an outermost layer of the multilayer film is a first layer, the $MgF_2$ film is arranged at a second layer or a third layer.

4. The optical product according to claim 1, wherein the ITO film is formed by vapor deposition with plasma treatment.

5. The optical product according to claim 1, wherein
    at the outermost layer of the multilayer film, a fluorine-based resin film or a $SiO_2$ film is arranged.

6. The optical product according to claim 5, wherein
    the $SiO_2$ film at the outermost layer of the multilayer film is formed by vapor deposition with plasma treatment.

7. The optical product according to claim 5, wherein a physical thickness of the fluorine-based resin film is not greater than 10 nanometers.

8. The optical product according to claim 1, wherein
    a plurality of the dielectric films including a high refractive index material and an intermediate refractive index material are formed, and
    in the multilayer film, the high refractive index material and the intermediate refractive index material are alternately arranged.

9. A method for manufacturing the optical product according to claim 1, wherein the ITO film is formed by vapor deposition with plasma treatment.

10. The method for manufacturing the optical product according to claim 9, wherein the outermost layer is a $SiO_2$ film which is formed by vapor deposition with plasma treatment.

* * * * *